United States Patent
Kuwahara et al.

(10) Patent No.: US 7,872,493 B2
(45) Date of Patent: Jan. 18, 2011

(54) CALIBRATION CIRCUIT

(75) Inventors: Shunji Kuwahara, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/453,730

(22) Filed: May 20, 2009

(65) Prior Publication Data

US 2009/0289659 A1  Nov. 26, 2009

(30) Foreign Application Priority Data

May 22, 2008  (JP)  ............................. 2008-134771

(51) Int. Cl.
*H03K 19/003* (2006.01)
(52) U.S. Cl. ......................................... 326/30; 326/21
(58) Field of Classification Search .................. 326/30, 326/21
See application file for complete search history.

(56) References Cited

U.S. PATENT DOCUMENTS

| | | | |
|---|---|---|---|
| 6,919,738 B2 * | 7/2005 | Kushida | 326/82 |
| 7,038,486 B2 * | 5/2006 | Aoyama et al. | 326/30 |
| 7,084,662 B1 * | 8/2006 | Om et al. | 326/30 |
| 7,221,193 B1 * | 5/2007 | Wang et al. | 327/108 |
| 2008/0046212 A1 | 2/2008 | Yoko et al. | |

FOREIGN PATENT DOCUMENTS

JP  2008-048361 A  2/2008

* cited by examiner

*Primary Examiner*—James Cho
(74) *Attorney, Agent, or Firm*—Foley & Lardner LLP

(57) ABSTRACT

In a calibration control circuit, a first clock gate circuit restricts passage of reference update clocks during a calibration period so as to stop a first one of the reference update clocks and supplies the restricted reference update clocks as first update clocks CLK1 to both a hit determination circuit and a second clock gate circuit. The second clock gate circuit 110 passes through the first update clocks CLK1 until reception of a hit signal from the hit determination circuit and delivers second update clocks CLK2 to an up/down counter 106. The up/down counter 106 is operated by the second update clocks CLK2. With this structure, the second update clocks used for adjustment steps can be increased in number during the calibration period.

14 Claims, 12 Drawing Sheets

CALIBRATION CIRCUIT

This application is based upon and claims the benefit of priority from Japanese patent application No. 2008-134771, filed on May 22, 2008, the disclosure of which is incorporated herein in its entirety by reference.

BACKGROUND OF THE INVENTION

1. Field of the Invention

The present invention relates to a semiconductor device, and more particularly to a semiconductor device having a calibration circuit connected to a calibration terminal or pad (ZQ). In this connection, the calibration circuit may be often called a ZQ calibration circuit in the instant specification.

2. Description of the Related Art

A semiconductor device (DRAM) called DDR3 is equipped with a ZQ calibration circuit which automatically adjusts an impedance of an output buffer of the device. FIG. 8 shows an example of a ZQ calibration circuit.

As shown in FIG. 8, a pull-up driver 802 and a pull-down driver 803 are connected to a DQ pad 801 within a chip. The ZQ calibration circuit serves to adjust output impedances of the pull-up driver 802 and the pull-down driver 803 by making use of an external resistance (240[Ω]) 805 which is connected to a ZQ pad 804 outside of the chip.

An ordinary ZQ calibration method employs a two-step adjustment method of first adjusting a pull-up (Pch) side, i.e., the pull-up driver 802 and then adjusting a pull-down (Nch) side, i.e., the pull-down driver 803.

Specifically, to adjust the Pch-side first, a Pch-side comparator 808 compares an output of a first Pch-side DQ replica 806 connected to the external resistance 805 through the ZQ pad 804 with an output (VDD/2[V]) of a Pch-side VDD/2 generation circuit 807.

A ZQ control circuit (namely, a calibration control circuit) 809 generates a Pch-replica code in response to an output of the Pch-side comparator 808 so that an output of the first Pch-side DQ replica 806 becomes equal to VDD/2[V]. A Pch-side replica control circuit 810 controls output impedances of the first Pch-side DQ replica 806 (and a second Pch-side DQ replica 811) according to the Pch-replica code.

When the output of the first Pch-side DQ replica 806 becomes equal to VDD/2[V] by repeating the above operation, the ZQ control circuit 809 determines or judges that the output impedance of the first Pch-side DQ replica 806 becomes equal to the external resistance 240[Ω] and generates a Pch-DQ code to put a state of the pull-up driver 802 into the same state of the first Pch-side DQ replica 806. With this operation, an output impedance of the pull-up driver 802 is set to 240[Ω] which is equal to the external resistance 805.

Next, adjustment of an Nch-side is performed. An output impedance of the second Pch-side DQ replica 811 is set to 240[Ω] by the adjustment operation on the Pch-side described above. An Nch-side comparator 814 compares an output of an Nch-side DQ replica 812 connected to the second Pch-side DQ replica 811 with an output of an Nch-side VDD/2 generation circuit 813. The ZQ control circuit 809 generates an Nch-replica code according to an output of the Nch-side comparator 814.

An Nch-side replica control circuit 815 adjusts an output impedance of the Nch-side DQ replica 812 according to the Nch-replica code. When the output of the Nch-side DQ replica 812 becomes equal to the output of the Nch-side VDD/2 generation circuit 813 by repeating the above operation, the ZQ control circuit 809 generates an Nch-DQ code to put a state of the pull-down driver 803 into the same state of the Nch-side DQ replica 812.

With the above operation, the output impedances of the pull-up driver 802 and the pull-down driver 803 are adjusted to the same value as that of the external resistance 805.

JEDEC (Joint Electron Devices Engineering Council) prescribes, as ZQ calibration commands, two types of calibration commands, i.e., a ZQCL (init, oper) (namely, ZQ Calibration Long) command and a ZQCS (ZQ calibration short) command.

The ZQCL command is a calibration command that is input when a DRAM is not accessed for a long period of time after a power is supplied and after a self refresh is performed and the like. As a result, a temperature and a voltage are varied when the ZQCL command is issued. Responsive to the ZQCL command, ZQ calibration is performed within a period of 512 tCK (init) or within a period of 256 tCK period (oper).

On the other hand, the ZQCS command is a calibration command that is periodically input (for example, each 128 ms) while the DRAM is ordinarily accessed. Responsive to the ZQCS command, the ZQ calibration is performed within a period of 64 tCK.

In the ZQ calibration, a certain predetermined time is needed to make a comparator compare voltages and to change impedance of a DQ replica buffer within a calibration operation. This shows that, when a frequency of external clocks becomes higher, it becomes difficult to adjust impedance each time the external clocks are activated. To cope with the above problem, the ZQ calibration usually controls impedance by the use of internal clocks obtained by dividing the external clocks.

FIG. 9 exemplifies the ZQ control circuit 809 which is illustrated in FIG. 8 and which has a divider circuit, namely, a frequency divider circuit.

The ZQ control circuit (calibration control circuit) 809 of FIG. 9 has the divider circuit 901, a B/E counter 902, a command latch circuit 903, a Pch-side hit determination circuit 904, a Pch-side mask circuit 905, a Pch-side AND circuit 906, a Pch-side up/down counter circuit 907, a Pch-side initial code storage unit 908, and first and second latch circuits 909, 910.

The illustrated ZQ control circuit 809 further has an Nch-side hit determination circuit 911, an Nch-side mask circuit 912, an Nch-side AND circuit 913, an Nch-side up/down counter circuit 914, an Nch-side initial code storage unit 915, and a third latch circuit 916.

Now, the ZQ control circuit 809 illustrated in FIG. 9 is given the input commands (cmd), such as ZQCL, ZQCS, the external clocks CK, and pull-up and pull-down comparator signals output from the comparators 808 and 814. The ZQ control circuit 809 has a divider circuit 901 which divides external clocks CK into divided clocks in accordance with a predetermined division factor (for example, may be equal to 16) and supplies the divided clocks as update clocks CKL to the Pch- and Nch-side hit determination circuits 904, 911, the mask circuits 905, 912, and the up/down counter circuits 907, 914. Thus, the ZQ control circuit 809 of FIG. 9 is operated in a single sequence of the update clocks CLK given as its basic clocks.

As described above, in the ZQ control circuit 809 of FIG. 9, the single sequence of the update clocks CLK is supplied to both the Pch- and Nch-side circuits. Therefore, it is also possible to share a single up/down counter on the pull-up and pull-down sides. In this case, the area occupied by the ZQ control circuit 809 can be reduced.

Next, an operation of the ZQ control circuit 809 will be explained with reference to FIG. 10 in addition to FIG. 9. Herein, FIG. 10 is a signal waveform diagram of various portions of the ZQ control circuit 809 illustrated in FIG. 9.

The divider circuit 901 generates the update clocks CLK by dividing the external clocks CK in the above-mentioned manner.

The B/E counter 902 counts the external clocks CK of the number (512, 256 or 64 tCK) prescribed according to an input command cmd and notifies the command latch circuit 903 of an end of count (end of ZQ calibration).

The command latch circuit 903 outputs Pch-enable signals or Nch-enable signals in response to the input command cmd (ZQCL or ZQCS) and stops an output thereof in response to a notification from the B/E counter 202.

In FIG. 10, the division factor of the divider circuit 901 is set to 16. Herein, it is assumed that the ZQCS command is input as the input command cmd and the Pch-enable signals are output from the command latch circuit 903. Further, it is assumed in FIG. 10 that an initial code #05 is stored in the initial code memory units 908 and 915.

Responsive to the ZQCS command, the command latch circuit 903 outputs the Pch-enable signals. Since a calibration period performed by the ZQCS command is prescribed as 64 tCK, as mentioned above, the Pch-enable signals are set to a high level only during a 64/16=4 [=update clock period].

When the Pch-enable signals are set to the high level, the Pch-side up/down counter 907 captures the initial code #5 stored in the Pch-side initial code storage unit 908 at the time a next update clock CLK rises. With this operation, an output D of the Pch-side up/down counter 907 is set to #05.

Thereafter, each time an update clock CLK rises, the Pch-side up/down counter 907 increases or decreases a count value according to an output E from the Pch-side hit determination circuit 904. With this operation, an output of the Pch-side up/down counter 907 changes from #05 to #08 through #06 and #07.

The Pch-side hit determination circuit 904 determines or judges a hit based on the comparator signal output from the Pch-side comparator (808 of FIG. 8). FIG. 10 shows the case where no "hit" is judged or detected within each high level period of the Pch enable signals. In this event, the first and the second latch circuits 909 and 910 latch the output D=#07 of the Pch-side up/down counter circuit 907 that appears at a time when the Pch-enable signals are changed to the low level.

In the illustrated example, it is to be noted that an effective update number of times (=a number of adjustment steps) of the Pch-side up/down counter circuit 907 is equal to two and that the adjustment steps are performed two times within second and third ones of the update clocks CLK during a calibration period (in 64/16=4).

The outputs D latched by the first and second latch circuits 909 and 910 are output to the outside as the Pch-replica code and the Pch-DQ code, respectively. Further, the Pch-DQ code is stored in the initial code storage unit 908 as a new initial code.

FIG. 11 shows a waveform of operation performed when judgment of "hit" is made in the Pch-side hit determination circuit 904 (FIG. 9) during the high level period of the Pch-enable signals.

When a pulse signal PHIT, representative of "hit", is output from the Pch-side hit determination circuit 904, the pulse signal is supplied as an output C from the Pch-side AND circuit 906 to the B/E counter 902. As a result, the B/E counter 902 stops counting the external clocks CK and notifies the command latch circuit 903 of the count stop.

On receiving the notification of the count stop from the B/E counter 902, the command latch circuit 903 changes the Pch-enable signals to the low level, as shown in FIG. 11. In response to the low level of the Pch-enable signals, an output D=#06 from the Pch-side up/down counter circuit 907 is latched by the first and second latch circuits 909 and 910. Thus, in this case, a period of the high level of the Pch-enable signals becomes shorter than 64 tCK.

The Nch-replica code and the Nch-DQ code in the Nch-side are also generated in a manner similar to the above-mentioned case.

As readily understood from FIGS. 10 and 11, the Pch-side up/down counter circuit 907 continues count-up or count-down, regardless of whether or not the ZQ calibration is performed, that is, regardless of whether or not the Pch-enable signals are set to the high level by the command latch 903. The Pch-side hit determination circuit 904 also receives an input of the comparator signals in timed relation with the update clocks CLK and determines a hit regardless of whether or not the Pch-enable signals are set to the high level. Accordingly, there is a possibility that the Pch-side hit determination circuit 904 also wrongly outputs a pulse signal PFALSE representative of detection of hit at a rise time of the first one of the update clocks CLK after the Pch-enable signals are changed to the high level, as illustrated in FIG. 11.

When such a pulse signal PFALSE is input to the B/E counter circuit 902, the Pch-enable signals are changed to the low level, and the ZQ calibration period is finished without practically executing any ZQ calibration operation.

To cope with the above problem, the Pch-side mask circuit 905 outputs a mask signal as an output B during a period in which the pulse signal PFALSE might appear at the start of calibration. The mask signal B is supplied to the Pch-side AND circuit 906 which serves to mask the pulse signal PFALSE.

Thus, since the pulse signal PFALSE is not supplied to the B/E counter circuit 902, the ZQ calibration can be normally started.

On the Nch-side, the pulse signal PFALSE is also output from the Nch-side hit determination circuit 911 for the first time and shows determination of hit. Like in the Pch-side, the pulse signal PFALSE can be prevented from being input to the B/E counter circuit 902 by using the Nch-side mask circuit 912 and the AND circuit 913 after the Nch-enable signal is changed to the high level.

Furthermore, the ZQ calibration period based on the ZQCL command is made longer than the ZQ calibration period based on the ZQCS command as described above. Accordingly, when, for example, the ZQCL command is input, it might be considered to perform a control operation such that the Nch-sides are continuously adjusted after adjustment of the Pch-side.

Referring to FIG. 12, description will be made about an operation of the ZQ control circuit 809, which is performed in response to a ZQCLinit command. In this event, the Nch-side is assumed to be continuously adjusted after the Pch-side is adjusted. Calibration operations on the Pch-side and the Nch-side are the same as that described above. Therefore, description will be mainly made about switching the calibration operation on the Pch-side to the calibration operation on the Nch-side.

When the ZQCL command is input, the Pch-side calibration is performed like in the above-mentioned manner.

When the Pch-side hit determination circuit 904 outputs a pulse signal PHIT representative of detection of hit in the form of one shot pulse, the pulse signal PHIT is given to the B/E counter 902 as the output C through the Pch-side AND circuit 906. On receiving the pulse signal PHIT, the B/E counter 902 initializes a count value and supplies an output Z to the command latch circuit 903. In response to the output Z from the B/E counter 902, the command latch circuit 903 falls down the Pch-enable signal and raises up the Nch-enable signal. Thereafter, the calibration on the pull-down side is performed like in the above-mentioned manner.

When the ZQCL command is executed, the number of clocks which can be used for an adjustment step during the calibration period (the number of all the update clocks 32 (=512/16)) is equal to 28.

As described above, the ZQ control circuit 809 illustrated in FIG. 9 performs calibration in response to the input command.

In the ZQ control circuit 809 described above, the up/down counter circuits, such as 907, 914 are always operated not only for the calibration period but also for a period except the calibration period.

Alternatively, proposal has been also made about a calibration circuit in which up/down counters are operated only when calibration is performed (for example, refer to Japanese Unexamined Patent Application Publication No. 2008-48361). In this event, the up/down counters are stopped except the duration of calibration.

A calibration period is prescribed by the number of external clocks. Accordingly, when the speed or frequency of the external clocks is increased, the calibration period becomes short in dependency upon the speed of the external clocks. Under the circumstances, a limited number of update clocks must be effectively used.

In the above-mentioned ZQ control circuit 809, since an initial code must be sent to the up/down counter at the start of calibration, update clocks are required to fetch each initial code. This structure brings about a problem that the update clocks should be used for fetching the initial code and, as a result, the update pulses usable for an adjustment step are reduced in number.

Further, when calibration starts, the above-mentioned ZQ control circuit masks signals output from the hit determination circuit. However, when the speed of the external clocks is increased, a plurality of update clocks (for example, two update clocks) may be masked. This shows that the number of update clocks which can be used for an adjustment step is also reduced Further, in the above-mentioned ZQ control circuit, it is assumed that calibration is performed in response to the ZQCL command. In this case, an operation for setting the Nch-enable signal to the high level must be performed within a single update clock after the hit signal is output from the Pch-side, in consideration of the number of adjustment steps. However, since the update clocks are not synchronized with the Pch- and Nch-enable signals, there is a problem in that a timing margin is made severe due to the existence of timing skew. When the Nch-enable signals are more delayed than a next update clock, a problem arises in that the number of the update clocks which can be used to the adjustment step is further reduced by one.

Further, since the calibration circuit disclosed in Japanese Unexamined Patent Application Publication No. 2008-48361 has no hit determination circuit (different from FIG. 9), the operation clocks of the up/down counter circuit are stopped by a calibration command issued from the outside or by set signals and reset signals based on the calibration command. Accordingly, even when an impedance adjustment of an output buffer is finished within a predetermined period, there is a possibility that power consumption increases because the up/down counter must be continuously operated until a predetermined period lapses.

Further, the calibration circuit disclosed in Japanese Unexamined Patent Application Publication No. 2008-48361 has such a structure that Pch-side calibration shifts to Nch-side calibration in response to reset signals which are activated based on that a half of a calibration period lapses when long calibration is performed based on the ZQCL command. Accordingly, even if the Pch-side calibration is finished before the half of the calibration period lapses, there is a possibility that the Pch-side calibration cannot be shifted to Nch-side calibration until the half of the calibration period lapses.

The present invention seeks to solve one or more of the above-mentioned problems by increasing a number of update clocks that can be used for an adjustment step during a calibration period.

The present invention seeks to solve one or more of the problems by stopping an operation of an up/down counter in response to completion of an impedance adjustment of an output buffer, even before calibration period lapses.

SUMMARY OF THE INVENTION

In one embodiment, there is provided a calibration circuit of an output circuit that comprises a replica circuit of the output circuit, a comparison circuit for comparing the potential of an output node of the replica circuit with a predetermined potential and outputting a result of the comparison as comparator signals, and a counter circuit for counting the comparator signals and outputting impedance adjustment signals for adjusting the impedances of the output circuit and the replica circuit, wherein the counter circuit stops a count operation on the completion of calibration operation.

In another embodiment, there is provided a calibration circuit of an output circuit having a pull-up side driver and a pull-down side driver. The calibration circuit has a pull-up side replica circuit that is a replica circuit of the pull-up side driver, a pull-down side replica circuit that is a replica circuit of the pull-down side driver, a pull-up side comparison circuit for comparing the potential of an output node of the pull-up side replica circuit with a predetermined potential and outputting a result of the comparison as a pull-up side comparator signal, a pull-down side comparison circuit for comparing the potential of an output node of the pull-down side replica circuit with a predetermined potential and outputting a result of the comparison as a pull-down side comparator signal, a pull-up side counter circuit for counting pull-up side comparator signals based on the impedance of the pull-up side replica circuit and outputting pull-up side impedance adjustment signals for adjusting the impedances of the pull-up side driver and the pull-up side replica circuit, and a pull-down side counter circuit for counting pull-down side comparator signals based on the impedance of the pull-down side replica circuit and outputting pull-down side impedance adjustment signals for adjusting the impedances of the pull-down side driver and the down-up side replica circuit, wherein the pull-up side counter circuit stops a count operation on the completion of the calibration operation of the pull-up side driver, and the pull-down side counter circuit stops a count operation on the completion of the calibration operation of the pull-down side driver.

In a further embodiment, there is provided a control method of a calibration circuit of an output circuit. The method comprises a step of counting, in a counter circuit, comparator signals showing a result of comparison of the potential of an output node of a replica circuit of the output circuit with a predetermined potential, and a step of stopping the count operation of the counter circuit for outputting impedance adjustment signals for adjusting the impedance of the output circuit on the completion of a calibration operation.

According to the present invention, the operation clocks are supplied to a hit determination circuit through a first gate circuit and are restricted within a period which is determined by a command by excluding a first or leading one of reference clock pulses. The operation clocks are supplied to the hit determination circuit after they are delayed in addition to an up/down circuit through a second gate circuit. With this structure, when hit signals are output from the hit determination circuit, the operation clocks supplied to the up/down counter are instantly stopped. As a result, the number of adjustment steps which can be performed during a calibration period can be increased.

Further, an operation of the up/down counter can be stopped on the completion of an impedance adjustment of an output buffer even before the calibration period passes. Since this structure dispenses with a mask circuit and an initial code storage unit, a circuit arrangement is simplified in structure. Further, since it is not necessary to write an initial code, an operation speed can be increased.

BRIEF DESCRIPTION OF THE DRAWINGS

The above-mentioned features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
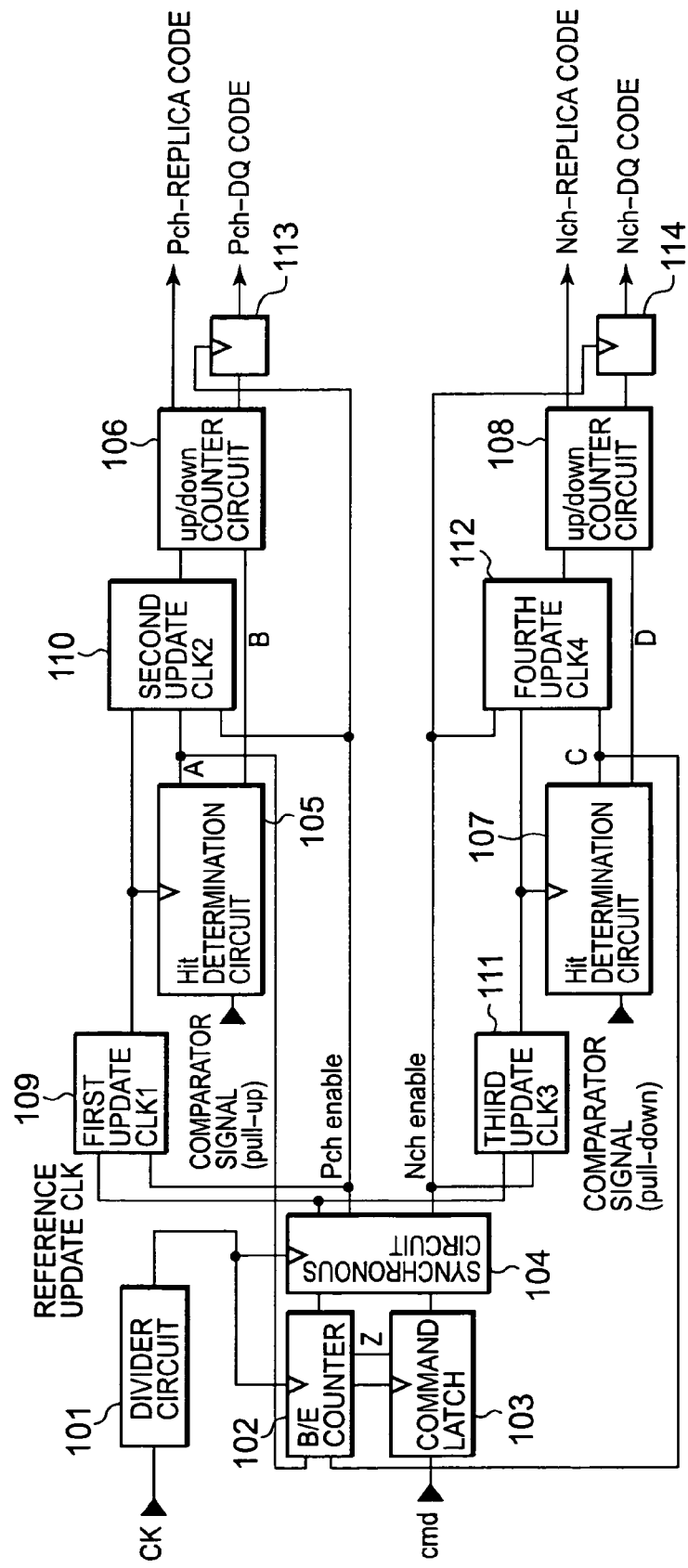
FIG. 1 is a block diagram for use in describing a ZQ control circuit according to a first embodiment of the present invention.

Embodiments of the present invention will be explained below referring to the drawings.

Referring to FIG. 1, a ZQ control circuit 100 according to a first embodiment of the present invention has a divider circuit 101, a B/E counter 102, a command latch circuit 103, a synchronous circuit 104, a Pch-side (pull-up side) hit determination circuit 105, and a Pch-side up/down counter circuit 106.

The illustrated ZQ control circuit 100 further has an Nch-side (pull-down side) hit determination circuit 107, an Nch-side up/down counter circuit 108, a first pull-up side clock gate circuit (hereinafter, called a first clock gate circuit) 109 which is a first pull-up side update clock gate circuit, a second pull-up side clock gate circuit (hereinafter, called a second clock gate circuit) 110 which is a pull-up side counter update clock gate circuit, a first pull-down side clock gate circuit (hereinafter, called a third clock gate circuit) 111 which is a first pull-down side update clock gate circuit, a second pull-down side clock gate circuit (hereinafter, called a fourth clock gate circuit) 112 which is a pull-down side counter update clock gate circuit, and first and second output latch circuits 113, 114.

Figure 8:
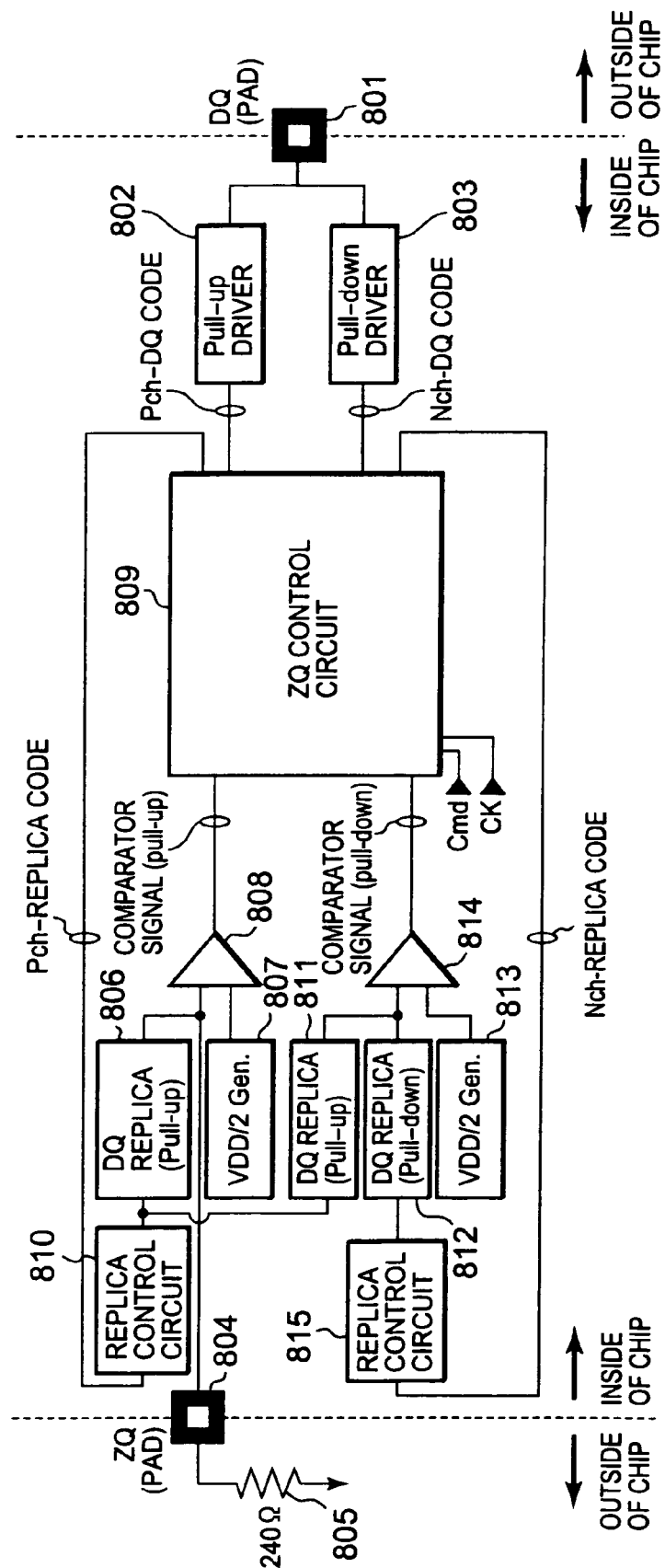
FIG. 8 is a view showing an arrangement example of a calibration circuit according to a related art.
Figure 9:
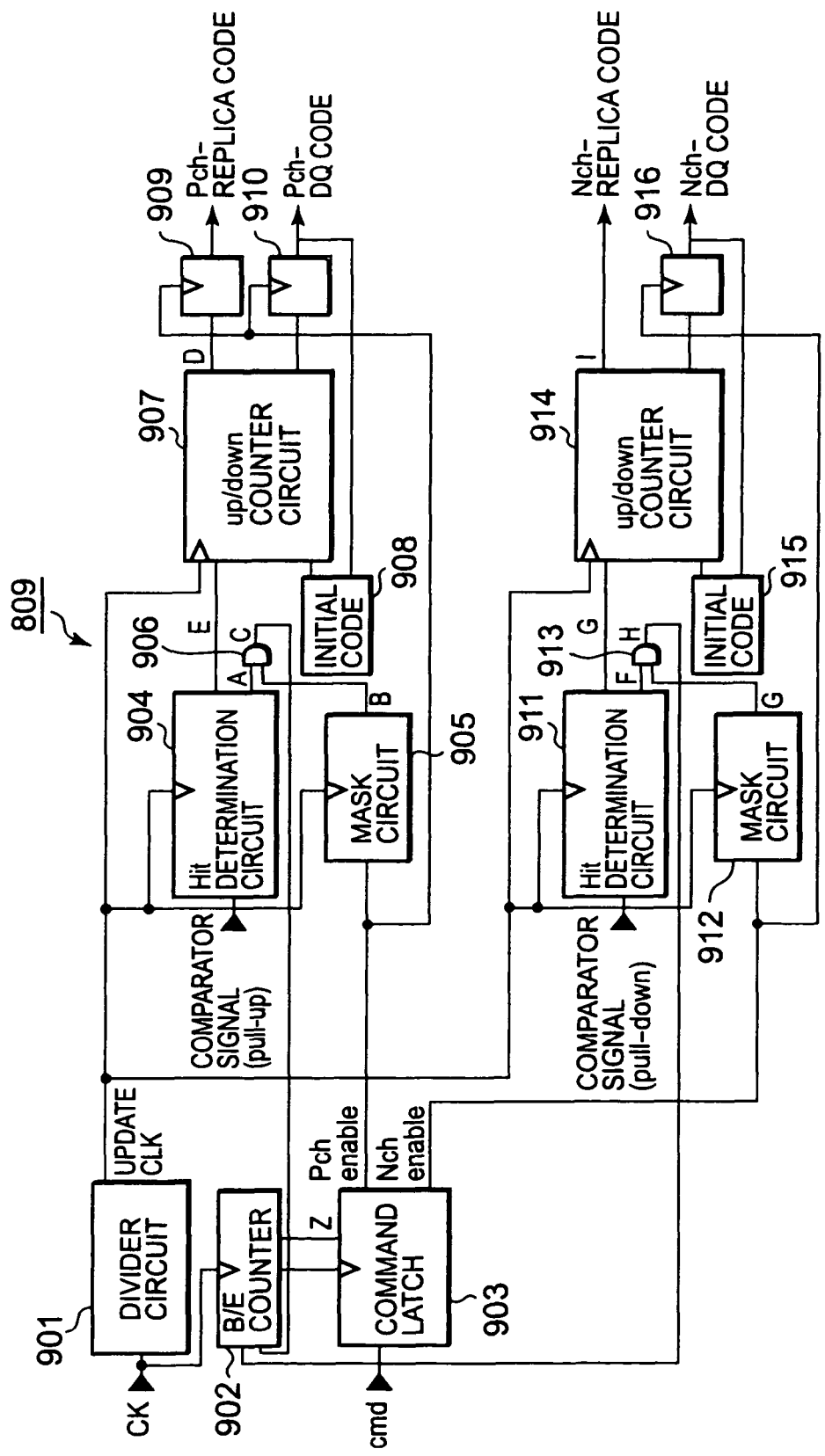
FIG. 9 is a view showing an arrangement example of a ZQ control circuit included in the calibration circuit of FIG. 8.

Responsive to the external clocks CK, the divider circuit 101 divides the external clocks CK into divided clocks by dividing the external clocks CK by a predetermined division factor (for example, 16) and supplies the divided clocks to the B/E counter 102 and the synchronous circuit 104 as basic clocks. Further, the divided clocks from the divider circuit 101 are also used as basic clocks of the calibration circuit (shown in FIG. 8).

The command latch circuit 103 notifies the B/E counter 102 of a type of a command in response to the input command cmd and outputs Pch-enable signals or Nch-enable signals through the synchronous circuit 104.

The B/E counter 102 starts counting the divided clocks to the number (for example, 512/16=32, 256/16=16 or 64/16=4) determined by the type of the command notified from the command latch circuit 103. When a hit signal is input from the hit determination circuit 105 or 107, the B/E counter circuit 102 initializes a count value and stops counting.

The synchronous circuit 104 delivers the divided clocks sent from the divider circuit 101 to the first and third clock gate circuits 109, 111 as reference update clocks CLK.

The first clock gate circuit 109 generates first update clocks CLK1 which are first pull-up side update clock signals with reference to the reference update clocks and the Pch-enable signals. The first update clocks CLK1 correspond to the reference update clocks which are input to a first clock gate circuit 109 during each period (namely, each calibration period) which is determined by each command. Herein, it is to be noted that the first update clocks CLK1 appears for each calibration period from which a first one of the update clocks (given to the first clock gate circuit 109) is excluded.

The Pch-side hit determination circuit 105 receives both first comparator signals (pull-up side comparator signals) from the Pch-side comparator (808 of FIG. 8) and the first update clocks CLK1 and generates first hit signals A on judging occurrence of the hit.

The second clock gate circuit 110 generates second pull-up side update clocks (hereinafter, called second update clocks) CLK2 which serve as pull-up side counter update clock signals, in response to the first update clocks CLK1, the first hit signals A, and the Pch-enable signals. Although the second update clocks CLK2 are obtained by delaying the first update clocks CLK1, the second update clocks CLK2 are not output after the first hit signals A are input to the second clock gate circuit 110.

The Pch-side up/down counter circuit 106 counts the first comparator signals B input through the Pch-side hit determination circuit 105 in synchronism with the second update clocks CLK2 and generates a Pch-replica code and a Pch-DQ code which serve as impedance adjustment signals.

The first output latch circuit 113 latches the Pch-DQ code from the Pch-side up/down counter circuit 106 at each trailing edge of the Pch-enable signals and outputs the latched Pch-DQ code to the outside.

Operations of the respective circuits on the pull-down side are the same as those of the respective circuits on the pull-up side.

More specifically, the third clock gate circuit 111 generates third update clocks CLK3 which serve as first pull-down side update clock signals based on the reference update clocks CLK and the Nch-enable signals.

The Nch-side hit determination circuit 107 outputs second hit signals C in response to both of second comparator signals (pull-up side comparator signals) output from the Nch-side comparator (see 814 of FIG. 8) and the third update clocks CLK3. The Nch-side hit determination circuit 107 also generates the second comparator signals D.

The fourth clock gate circuit 112 generates fourth update clocks CLK4, which serve as second pull-down side counter update clock signals, in response to the second hit signals C, the third update clocks CLK3, and the Nch-enable signals.

The Nch-side up/down counter circuit 108 counts the second comparator signals sent through the Nch-side hit determination circuit 107, in accordance with the fourth update clocks CLK4 and generates an Nch-replica code and an Nch-DQ code which serve as impedance adjustment signals.

The second output latch circuit 114 latches the Nch-DQ code from the Nch-side up/down counter circuit 108 at each trailing edge of the Nch-enable signals and outputs the latched Nch-DQ code to the outside.

Figure 2:
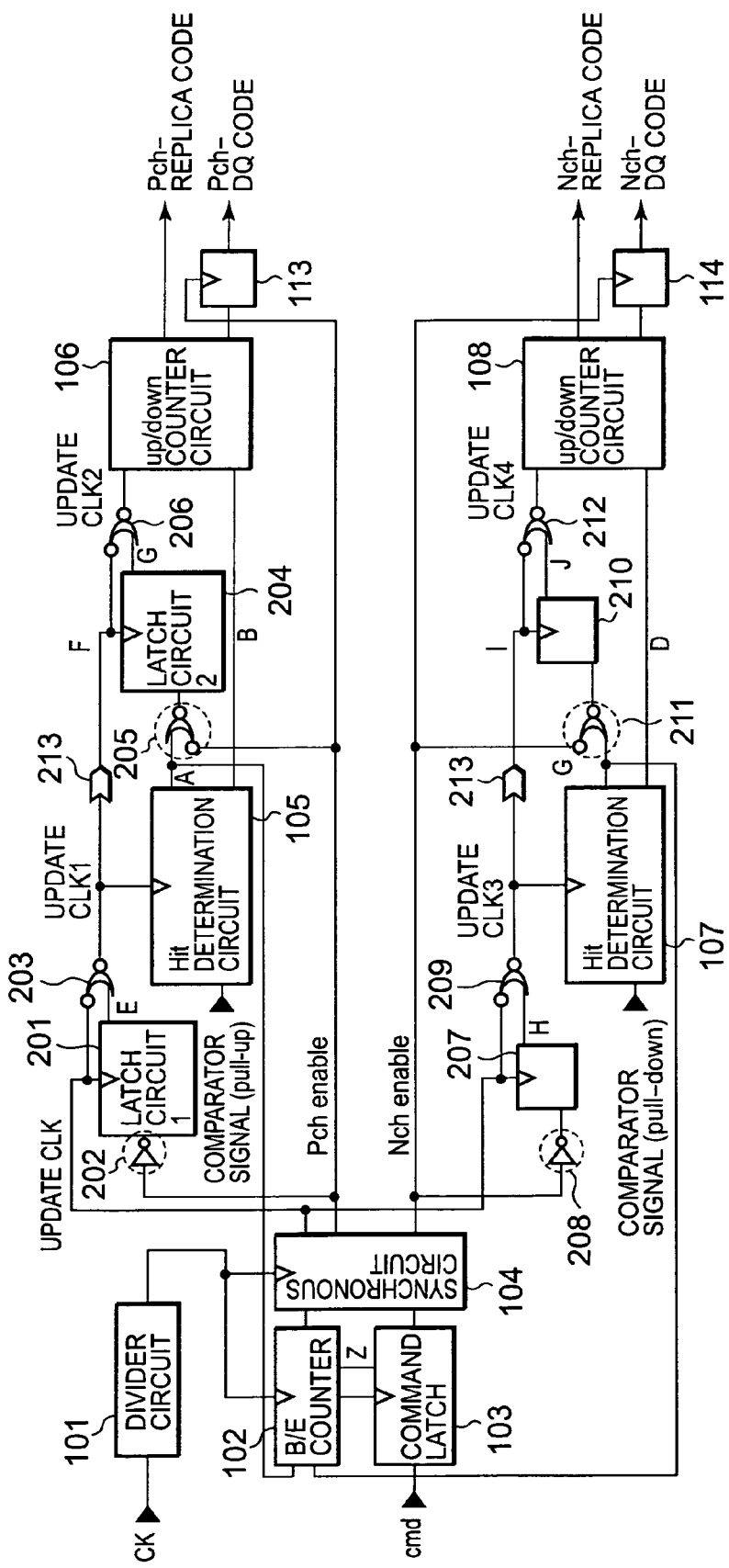
FIG. 2 is a view clarifying an arrangement example of a clock gate circuit of the ZQ control circuit of FIG. 1.

The first to fourth clock gate circuits 109 to 112 shown in FIG. 1 may be structured in a manner illustrated in FIG. 2.

Referring to FIG. 2, the first clock gate circuit 109 has a first latch circuit 201 and an inverter 202 for logically inverting the Pch-enable signals and supplying their inverted signals to an input terminal of the first latch circuit 201. In addition, the first clock gate circuit 109 further has a first NOR circuit 203 for carrying out NOR operation between the inverted signals of the reference update clocks CLK and the outputs from the first latch circuit 201 and outputs a result of the NOR operation as the first update clocks CLK1.

Further, the second clock gate circuit 110 has a second latch circuit 204, a second NOR circuit 205, and a third NOR circuit 206. The second NOR circuit 205 carries out NOR operation between the outputs of the Pch-side hit determination circuit 105 and the inverted signals of the Pch-enable signals and supplies a result of the NOR operation to an input terminal of the second latch circuit 205. The third NOR circuit 206 carries out NOR operation between the inverted signals of the first update clocks CLK1 and the outputs of the second latch circuit 204 and generates a result of the NOR operation as the second update clocks CLK2.

Further, the third clock gate circuit 111 has a third latch circuit 207, an inverter 208 for logically inverting the Nch-enable signals and supplying inverted Nch-enable signals to an input terminal of the third latch circuit 207, and a fourth NOR circuit 209 for carrying out NOR operation between the inverted signals of the reference update clocks CLK and the outputs from the third latch circuit 207. The fourth NOR circuit 209 produces a result of the NOR operation as the third update clocks.

Further, the fourth clock gate circuit 112 has a fourth latch circuit 210, a fifth NOR circuit 211 for carrying out NOR operation between the outputs from the Nch-side hit determination circuit 107 and the inverted signals of the Nch-enable signals and supplying a result of the NOR operation to an input terminal of the fourth latch circuit 210, and a sixth NOR circuit 212 for carrying out NOR operation between the inverted signals of the third update clock CLK3 and the outputs from the fourth latch circuit 210 and outputting a result of the NOR operation as the fourth update clocks CLK4.

Next, an operation of the ZQ control circuit of FIG. 2 will be explained also referring to FIG. 3.

Figure 3:
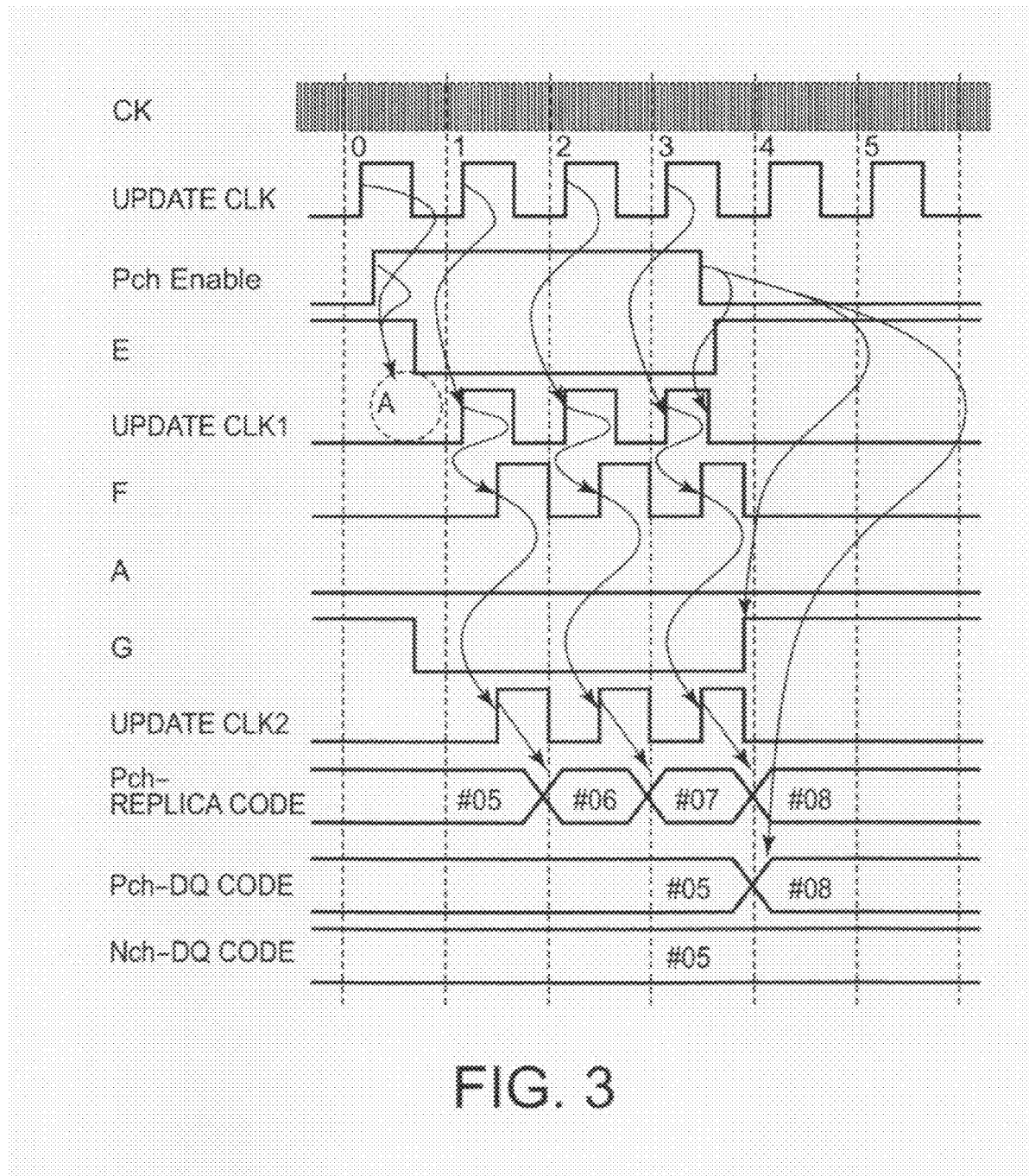
FIG. 3 is a view showing an example of signal waveforms of various portions which are operated in response to a ZQCS command from the ZQ control circuit of FIG. 2.

FIG. 3 shows a waveform diagram for describing operation of various portions of FIG. 2 in the case where the ZQCS command is input to the command latch circuit 103. It is assumed that the division factor of the divider circuit 101 is equal to 16 and #5 is latched as the Pch-DQ code latched by the first output latch circuit 910 in an initial state.

Responsive to the ZQCS command, the command latch circuit 103 notifies the B/E counter circuit 102 of arrival of the ZQCS command and generates the Pch-enable signals.

The B/E counter circuit 102 starts counting the divided clocks up to the number determined by each of the commands, namely, ZQCS command.

Responsive to the divided clocks, the synchronous circuit 104 outputs the reference update clocks CLK and the Pch-enable signals. The Pch-enable signals are inverted by the inverter 202 and thereafter supplied to the first latch circuit 201 at a time instant somewhat delayed in relative to a zeroth one of the reference update clocks CLK.

The first latch circuit 201 latches the inverted Pch-enable signal at the trailing or falling edge of the zeroth one of the reference update clocks CLK and keeps the inverted Pch-enable signal, as shown by E in FIG. 3 until the Pch-enable signal falls down.

While no hit signal is output from the Pch-side hit determination circuit 105, the first latch circuit 201 continuously generates the output signal E shown in FIG. 3. Specifically, the output signal E of the first latch circuit 201 is put into a low level at the trailing or falling edge of the zeroth one of the reference update clocks CLK and keeps the low level until a trailing or falling edge of the third one of the reference update clocks CLK.

While the output signal E from the first latch circuit 201 is kept at the low level, the first NOR circuit 203 allows the reference update clocks CLK to pass therethrough. This operation makes it possible to produce the first update clocks CLK1 which correspond to the first to third ones of the reference update clocks CLK except the zeroth one of the reference update clocks.

As shown in FIG. 3, the first update clocks CLK1 includes no zeroth one of the reference update clocks CLK and therefore, the zeroth one of the reference update clocks CLK is not input to the hit determination circuit 105. As a result, the hit determination circuit 105 never generates, for the zeroth one of the reference update clocks CLK, an erroneous hit signal which might be produced due to the comparator signal generated at a start of calibration. Thus, the above-mentioned structure effectively dispenses with any mask circuit.

While the Pch-enable signals are kept at the high level, let the Pch-side hit determination circuit 105 generate no hit signal, as shown by A in FIG. 3. In this event, the NOR circuit 205 produces the inverted signals of the delayed Pch-enable signals which are latched by the second latch circuit 204 and which are supplied to the NOR circuits 206 as output signals G. As a result, the NOR circuit 206 produces, as the second update clocks CLK2, signals F which are obtained by delaying the update clocks CLK1 (or through a delay circuit 213 if necessary) and which are supplied to the Pch-side up/down counter circuit 106.

Figure 10:
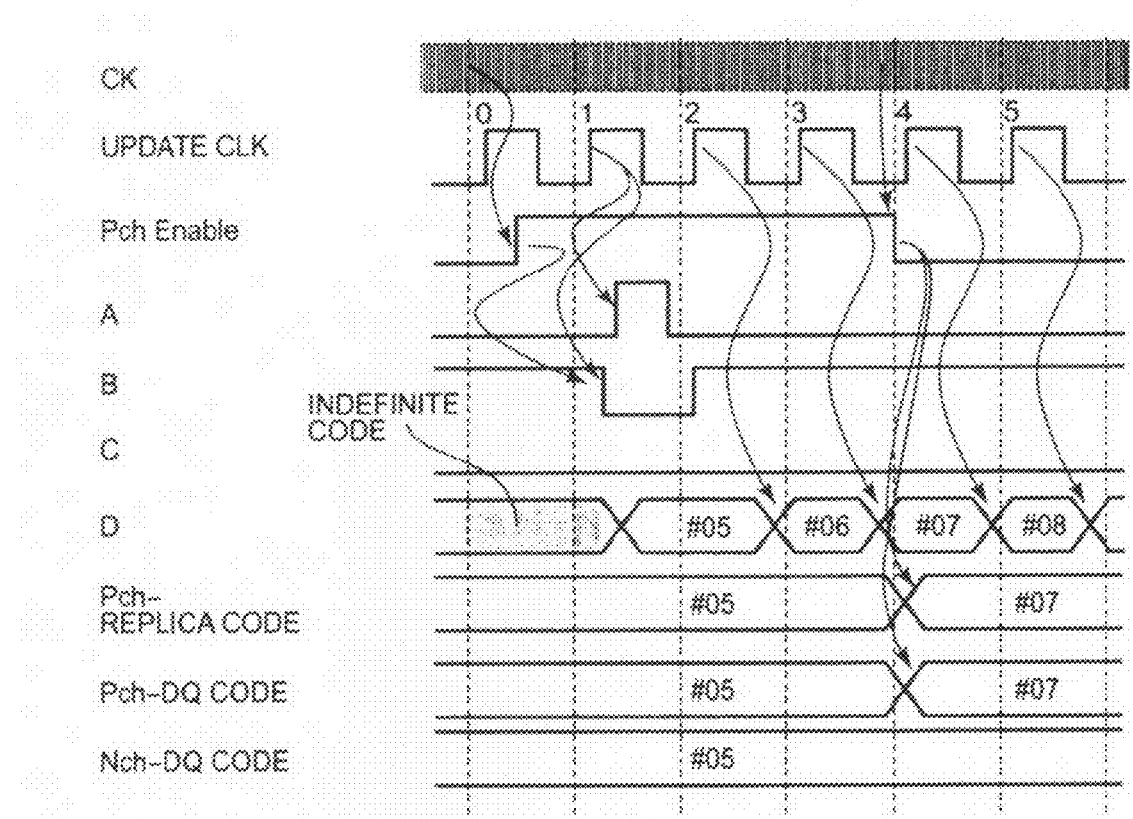
FIG. 10 is a view showing an example of signal waveforms of various portions which are operated in response to a ZQCS command from the ZQ control circuit of FIG. 9.
Figure 11:
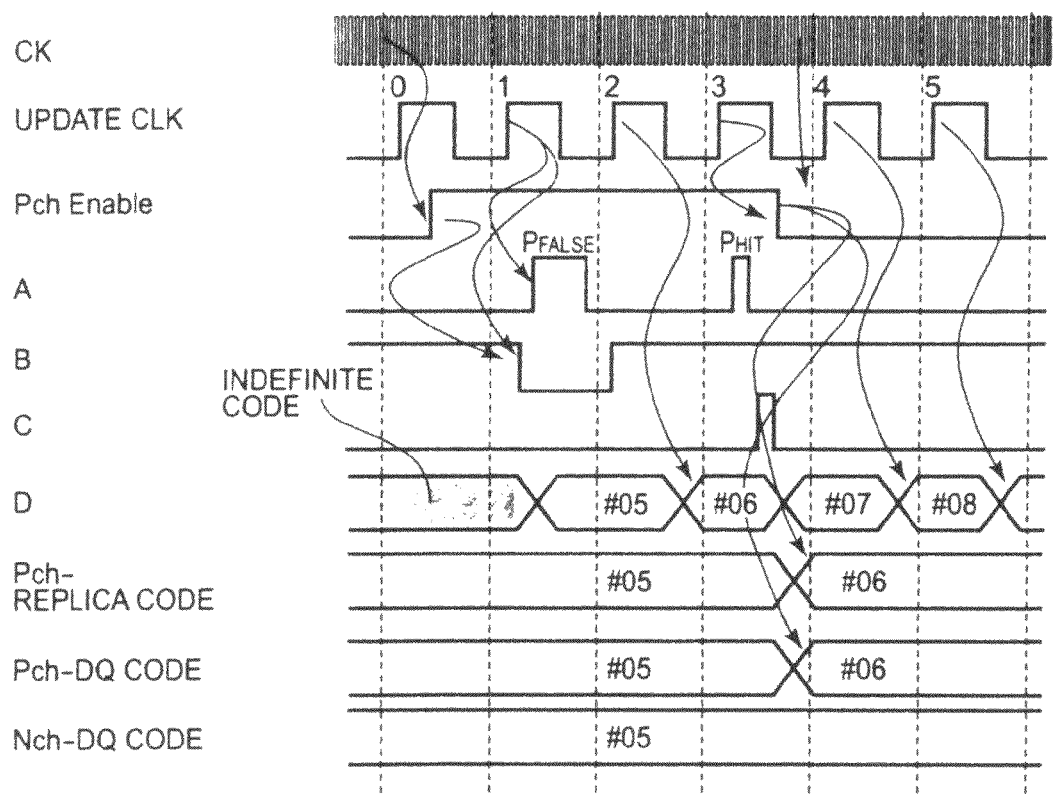
FIG. 11 is a view showing another example of the signal waveforms of the respective portions which are operated in response to the ZQCS command from the ZQ control circuit of FIG. 9.
Figure 12:
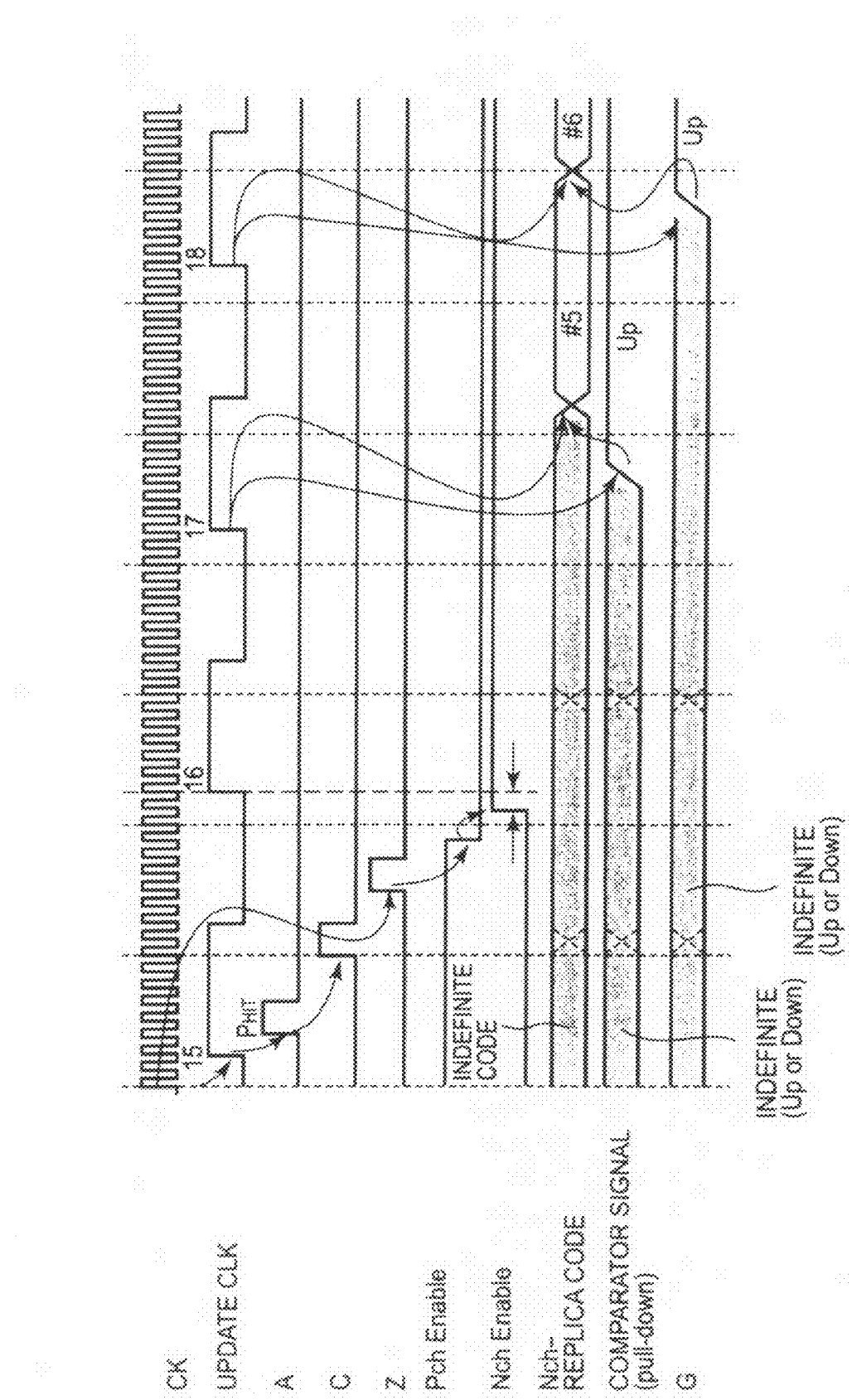
FIG. 12 is a view showing an example of signal waveforms of the respective portions which are operated in response to a ZQCL command from the ZQ control circuit of FIG. 9.

As described above, the second update clocks CLK2 which correspond to the first to third ones of the reference update clocks CLK are supplied to the Pch-up/down counter circuit 106. The Pch-side up/down counter circuit 106 increases or decreases a count value in response to output signals B from the Pch-side hit determination circuit 105 in synchronism with the second update clocks CLK2 and outputs the count value as the Pch-replica code. As described above, the embodiment can execute adjustment steps during a calibration period three times which are greater by one than the adjustment steps shown in FIG. 10.

Further, since the second update clocks CLK2 are not activated during a period other than the calibration period (namely, taking no high level), the count value of the Pch-up/down counter circuit 106 is kept up to the start of a next calibration operation. Accordingly, an initial code may not be written into the Pch-up/down counter circuit 106 again at the start of the next calibration.

When the Pch-enable signal is changed to the low level, the first output latch circuit 113 latches the count value of the Pch-side up/down counter circuit 106 and outputs it as the PchDQ code.

Figure 4:
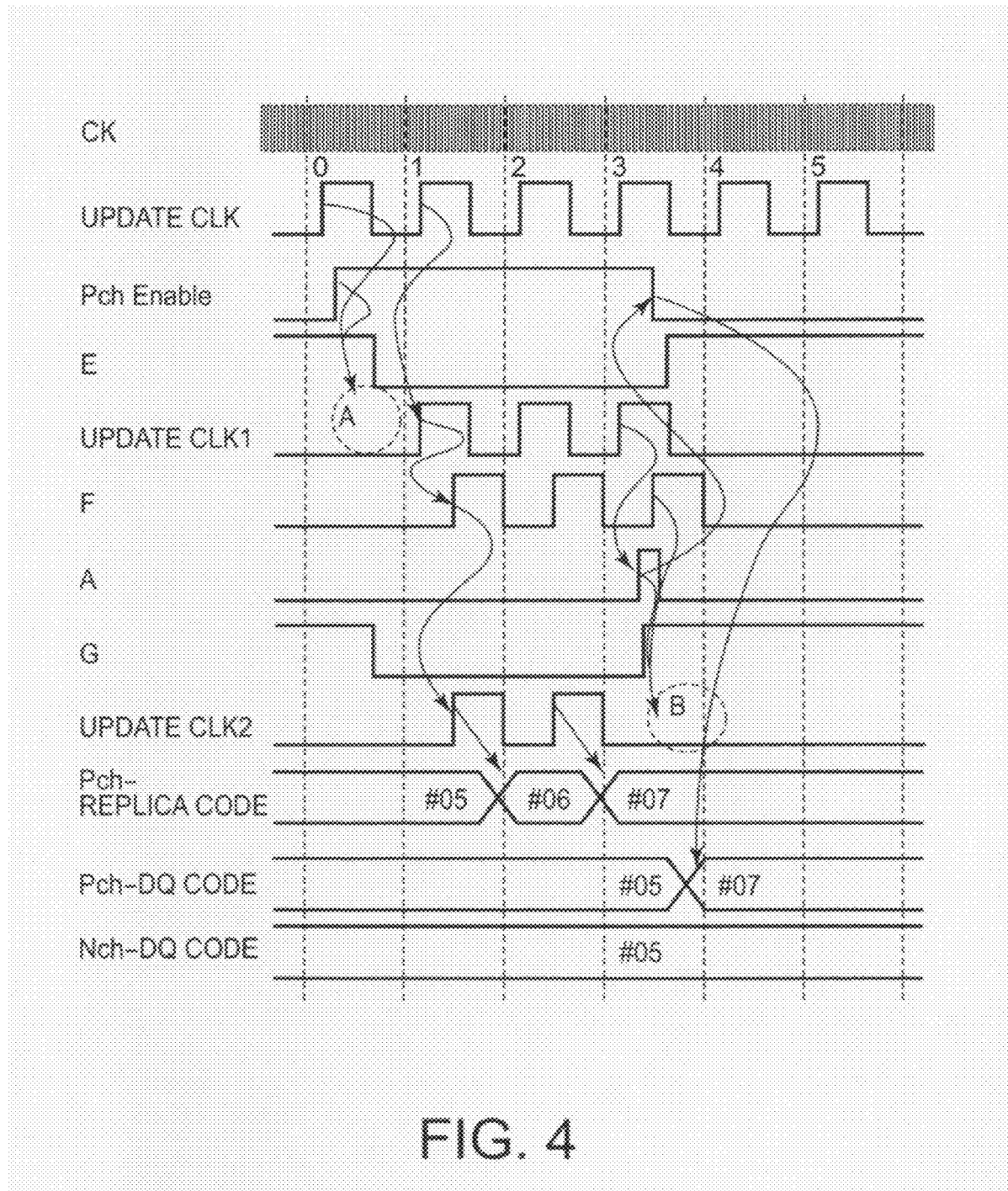
FIG. 4 is a view showing another example of the signal waveforms of the respective portions of FIG. 2 which are operated in response to the ZQCS command from the ZQ control circuit.

Referring to FIG. 4, description will be made about an operation of the ZQ control circuit 100 of FIG. 2 which is performed when a hit signal A is output from the hit determination circuit 105. The illustrated ZQ control circuit 100 is operated in the manner mentioned above until the hit signal is output.

It is assumed that the Pch-side hit determination circuit 105 judges that the count value is hit (a calibration value reaches a target value) with reference to the first comparator signals at a leading or rising edge of a specific one of the first update clocks CLK1 that corresponds to the third one of the reference update clocks CLK in the illustrated example.

On detecting the hit, the Pch-side hit determination circuit 105 produces a hit signal A in the form of one shot pulse, as shown in FIG. 4. The hit signal A is given to the NOR circuit 205. Responsive to the hit signal A, the NOR circuit 205 generates the low level and, as a result, the output signal G of the second latch circuit 204 is changed to the high level and is sent to the NOR circuit 206.

When the output signal G from the second latch circuit 204 becomes the high level, the NOR circuits 206 stops passage of the signals F at once which are obtained by delaying the first update clocks CLK1. With this operation, supply of the second update clocks CLK2 to the Pch-side up/down counter circuit 106 is stopped, and consequently, the Pch-side up/down counter circuit 106 keeps the count value at the time of judging the hit. Accordingly, the initial code may not be written at the start of the next following calibration.

Thereafter, when the Pch-enable signal is changed to the low level, the first output latch circuit 113 latches the count value of the Pch-side up/down counter circuit 106 and outputs it as the Pch-DQ code.

As described above, the Pch-side up/down counter circuit 106 keeps the count value when a calibration period is finished regardless of whether or not the count value is hit. Therefore, the initial code may not be written at a start of a next following calibration operation. Thus, the illustrated ZQ control circuit 100 can be simplified in structure and an operation speed can be increased.

A calibration operation similar to the Pch-side is performed also in connection with the Nch-side in the above-mentioned manner.

Figure 5:
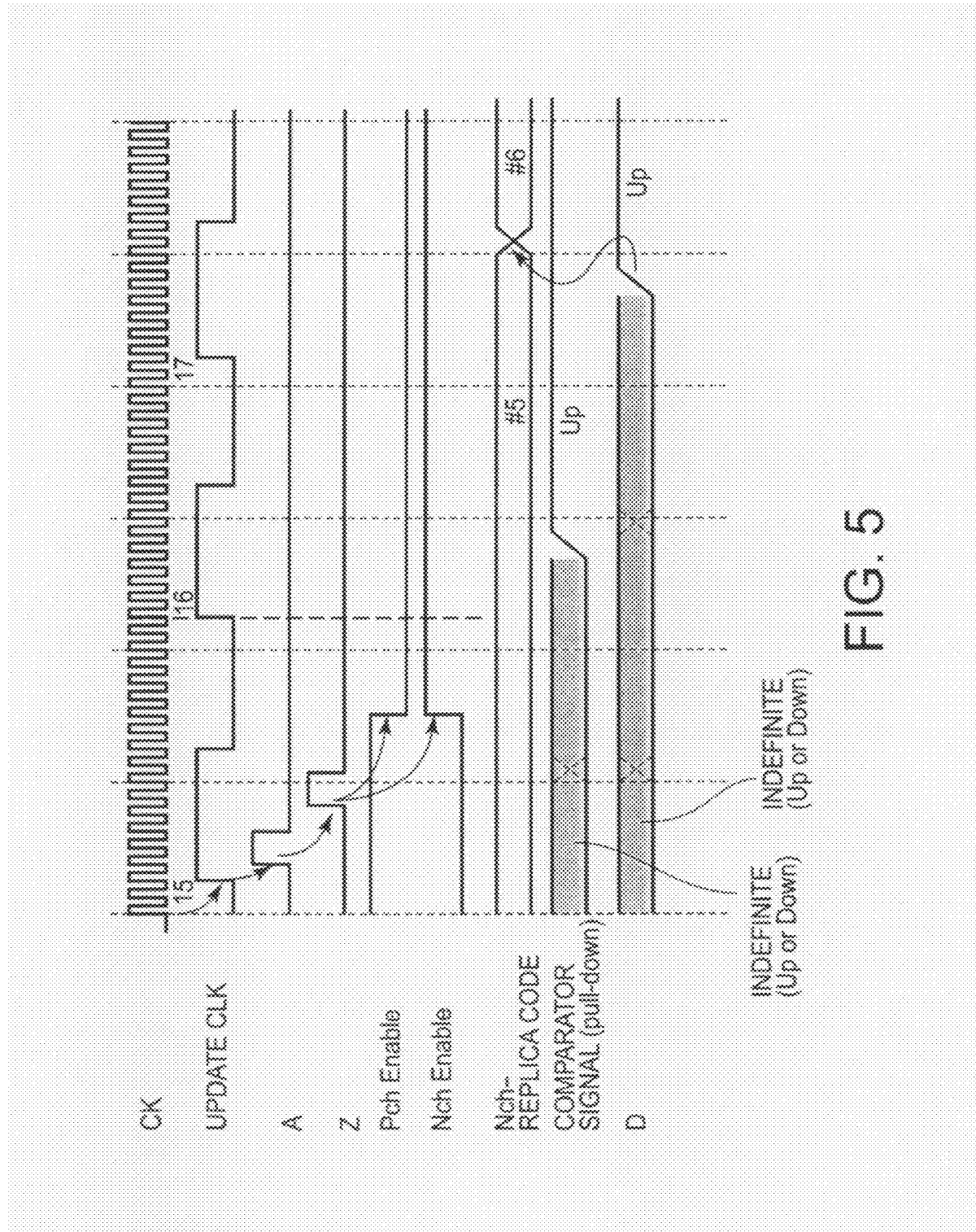
FIG. 5 is a view showing an example of signal waveforms the of various portions which are operated in response to a ZQCL command from the ZQ control circuit of FIG. 2.

Referring to FIG. 5, description will be made about an operation which is switched from the Pch-side to the Nch-side in a calibration operation performed based on the ZQC-Linit command.

FIG. 5 shows waveforms of various portions of the ZQ control circuit 100 illustrated in FIG. 2. Here, an initial value of the Nch-replica code is assumed to be set to #05.

When the ZQCL command is input to the command latch circuit 103, the calibration operation on the Pch-side is executed as described above. Specifically, when the hit signal A appears in the form of one shot pulse from the Pch-side hit determination circuit 105, the B/E counter circuit 102 puts the count value into an initial value and supplies a notification signal Z to the command latch unit 103 in order to inform the command latch unit 103 of appearance of the hit signal A.

Responsive to the notification signal Z, the command latch circuit 103 puts the Pch-enable signal into the low level and, instead, puts the Nch-enable signal into the high level. The synchronous circuit 103 synchronizes a fall of the Pch-enable signals with a rise of the Nch-enable signals in accordance with the divided clocks. In the embodiment, since no timing skew exists between the fall of the Pch-enable signals and the rise of the Nch-enable signals, the ZQ control circuit 100 can instantly start an Nch-side adjustment in response to a next update clock CLK. Therefore, the ZQ control circuit 100 can also cope with a high speed external clock when the external clock is supplied at a high speed.

Thereafter, the replica code on the Nch-side is switched to the initial code (#05), and Nch-side calibration is performed. In this case, the adjustment step of the ZQCL command is performed 29 times in all the update clocks 32 (=512/16).

Figure 6:
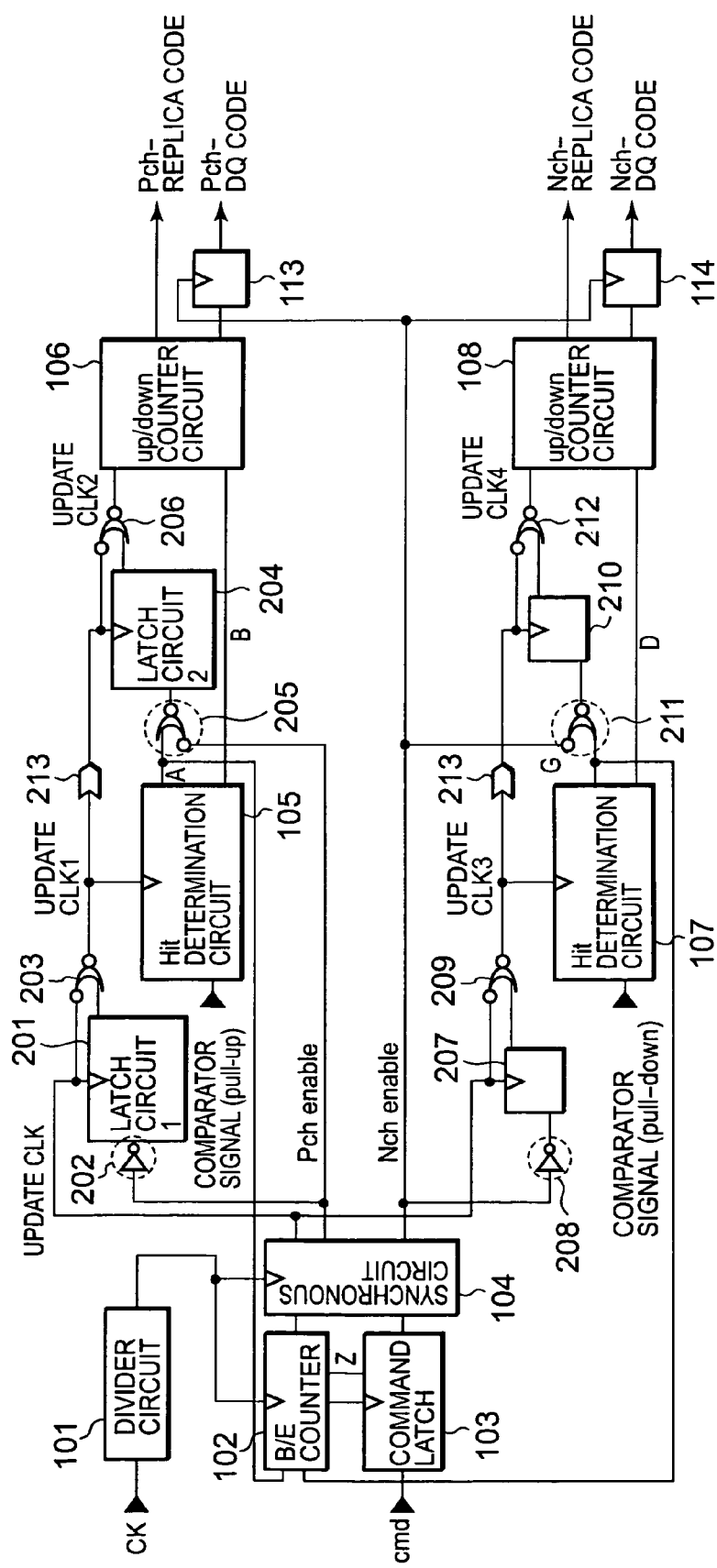
FIG. 6 is a view showing an arrangement of a ZQ control circuit according to a second embodiment of the present invention.
Figure 7:
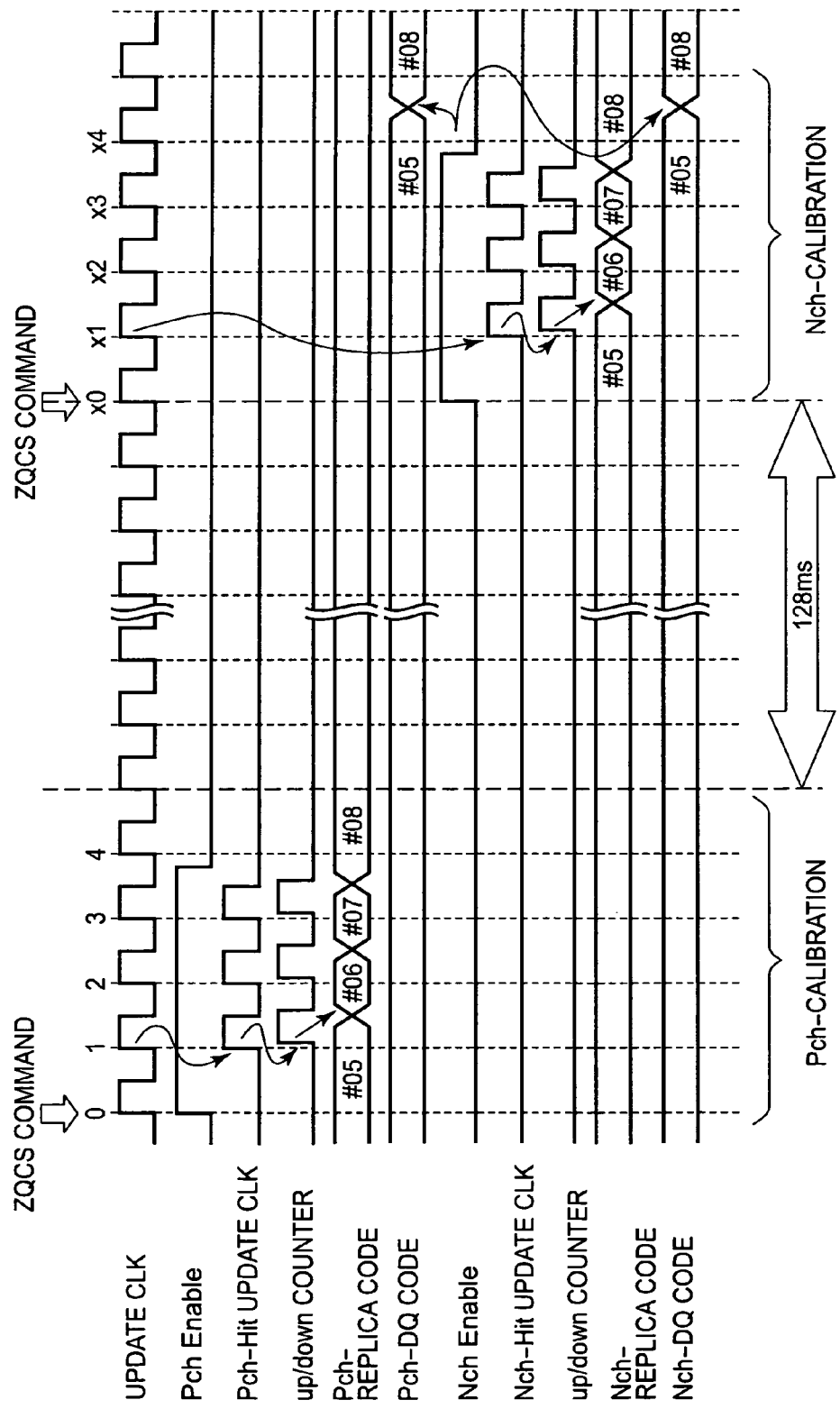
FIG. 7 is a view showing of an example of signal waveforms of respective portions which are operated in response to a ZQCL command from a ZQ control circuit of FIG. 6.

Referring to FIGS. 6 and 7, description will be made about a ZQ control circuit 100a according to a second embodiment of the present invention.

The second embodiment is different from that of FIG. 2 in that the ZQ control circuit 100a illustrated in FIG. 6 supplies the Nch-enable signal to the first output latch circuit 113 in place of the Pch-enable signal.

As shown in FIG. 7, the ZQCS command is periodically given to the ZQ control circuit 100a at each of time intervals of 128 ms. The ZQ control circuit according to the second embodiment of the present invention is structured so that Pch-side calibration and Nch-side calibration are alternately performed each time when the ZQCS command is input. In the embodiment, even if the Pch-side calibration is finished, the first output latch circuit 113 is not updated, and when Nch-side calibration is also finished, both the first output latch circuit 113 and the second output latch 114 are updated at the same time.

With this operation, since unbalance operations between the pull-up driver (802 of FIG. 8) and the pull-down driver (803 of FIG. 8) can be prevented, as mentioned below, DQ codes can be output accurately.

In the related art, since the up/down counter circuit can not keep a count value at an end point of calibration, the DQ codes should be individually output on the completion of each of the pull-up side calibration and the pull-down side calibration. In the calibration based on the ZQCS command, the pull-up side calibration and the pull-down side calibration are alternately performed at the intervals. In this event, it often happens that update or renewal is performed about only one of the pull-up side and the pull-down side. In this situation, a long time is required until processing a next ZQCS command is completed, which results in unbalance between the pull-up driver and the pull-down driver.

On the other hand, since the embodiment according to the present invention simultaneously latches the DQ-codes in both the pull-up side and pull-down side in response to the Nch-enable signals, the unbalance can be avoided.

What is claimed is:

1. A device comprising:
   an output circuit;
   a replica circuit of the output circuit, which has an output node;
   a comparison circuit that compares an electric potential of the output node of the replica circuit with a predetermined potential to output a result of the comparison as a comparator signal;
   a counter circuit that updates a counter value thereof based on the comparator signal, outputs an impedance adjustment signal to adjust impedances of the output circuit and the replica circuit;
   wherein the counter circuit stops updating the counter value on a completion of a calibration operation; and
   a counter update clock gate circuit that supplies a counter update clock signal to the counter circuit and a determination circuit that determines the completion of the calibration operation and output a hit determination signal to the counter up date clock gate circuit, and wherein when the calibration operation is completed, the determination circuit activates the hit determination signal to inactivate the counter update clock signal and the counter circuit stops updating the counter value in response to an inactivation of the counter update clock signal.

2. The device as claimed in claim 1, wherein the determination circuit judges the completion of the calibration operation with reference to the comparator signal.

3. The device as claimed in claim 2, further comprising a first update clock gate circuit that generates a first update clock signal in response to a reference update clock signal based on a clock signal inputted from an outside when an enable signal is activated in response to a calibration command, and wherein the counter update clock gate circuit generates the counter update clock signal in response to the first update clock signal until the hit determination signal are activated.

4. The device as claimed in claim 3, further comprising a dividing circuit that divides the clock signal inputted from the outside to output as the reference update clock signal.

5. The device as claimed in claim 3, wherein the enable signal is activated after a first clock pulse of the reference update clock signal is supplied to the first update clock gate and before a second clock pulse of the reference update clock signal is supplied to the first update clock gate.

6. The device as claimed in claim 3, wherein the first update clock gate circuit comprises:
   a first latch circuit;
   a first inverter inverting the enable signal and supplying the inverted ones to an input terminal of the first latch circuit; and
   a first NOR circuit carrying out NOR operation between the inverted signals of the reference update clock signals and the outputs of the first latch circuit and outputting results of the NOR operation as the first update clock signals,
   wherein the counter update clock gate circuit comprises;
   a second latch circuit;
   a second NOR circuit carrying out NOR operation between the hit determination signals and the inverted signal of the enable signal and supplying results of the NOR operation to an input terminal of the second latch circuit;
   a third NOR circuit carrying out NOR operation between the inverted signals of the first update clock signals and the outputs of the second latch circuit and outputting results of the NOR operation as the counter update clock signals.

7. The device as claimed in claim 1, wherein;
   the output circuit comprises a pull-up side driver and a pull-down side driver;
   the replica circuit has a pull-up side replica circuit that is a replica circuit of the pull-up side driver, or a pull-down side replica circuit that is a replica circuit of the pull-up side replica circuit and the pull-down side driver; and
   an output node of the replica circuit is an intermediate node between the pull-up side replica circuit and a predetermined resistor connected to an external pin or an intermediate node between the pull-up side replica circuit and the pull-down side replica circuit.

8. A calibration circuit of an output circuit having a pull-up side driver and a pull-down side driver, comprising:
   a pull-up side replica circuit that is a replica circuit of the pull-up side driver;
   a pull-down side replica circuit that is a replica circuit of the pull-down side driver;
   a pull-up side comparison circuit comparing the potential of an output node of the pull-up side replica circuit with a predetermined potential and outputting a result of the comparison as a pull-up side comparator signal;
   a pull-down side comparison circuit comparing the potential of an output node of the pull-down side replica circuit with a predetermined potential and outputting a result of the comparison as a pull-down side comparator signal;
   a pull-up side counter circuit counting pull-up side comparator signals based on the impedance of the pull-up side replica circuit and outputting pull-up side impedance adjustment signals for adjusting the impedances of the pull-up side driver and the pull-up side replica circuit;
   a pull-down side counter circuit counting pull-down side comparator signals based on the impedance of the pull-down side replica circuit and outputting pull-down side impedance adjustment signals for adjusting the impedances of the pull-down side driver and the pull-down side replica circuit,
   wherein the pull-up side counter circuit stops a count operation on the completion of the calibration operation of the pull-up side driver;
   the pull-down side counter circuit stops a count operation on the completion of the calibration operation of the pull-down side driver;
   a pull-up side counter update clock gate circuit supplying pull-up side counter update clock signals to the pull-up side counter circuit;
   a pull-down side counter update clock gate circuit supplying pull-down side counter update clock signals to the pull-down side counter circuit;
   a pull-up side determination circuit determining completion of the calibration operation of the pull-up side driver and outputting pull-up side hit determination signals that show a result of the determination to the pull-up side counter update clock gate circuit; and
   a pull-down side determination circuit determining completion of the calibration operation of the pull-down side driver and outputting pull-down side hit determination signals that show a result of the determination to the pull-down side counter update clock gate circuit, wherein when the completion of the calibration operation of the pull-up side driver is shown, the count operation of the pull-up side counter circuit is stopped by putting the pull-up side counter update clock signals of the pull-up side counter update clock gate circuit into a non-active state; and when the completion of the calibration operation of the pull-down side driver is shown, the count operation of the pull-down side counter circuit is stopped by putting the pull-down side counter update clock signals of the pull-down side counter update clock gate circuit into a non-active state.

9. A calibration circuit according to claim 8, wherein the pull-up side counter update clock signals and the pull-down side counter update clock signals are controlled independently of each other.

10. A device comprising:

a first terminal;

first and second driver circuits coupled to the first terminal and respectively indicative of first and second impedances;

a first counter circuit adjusting, when being supplied with a first clock signal, the first impedance of the first driver circuits;

a second counter circuit adjusting, when being supplied with a second clock signal, the second impedance of the second driver circuits; and a control circuit operative to supply one of the first and second clock signals to an associated one of the first and second counter circuits while stopping supply of the other of the first and second clock signals to an associated one of the first and second counter circuits.

11. The device as claimed in claim 10, wherein the control circuit includes first and second circuit units and first and second determination circuits;

wherein the first and second circuit units respectively generate the first and the second clock signals;

wherein the first determination circuit supplies, when the first impedance of the first driver circuit has reached or crossed a first reference value, the first circuit unit with a first hit signal so that the first circuit unit stops supply of the first clock signal to the first counter circuit in response to the first hit signal; and wherein the second determination circuit supplies, when the second impedance of the second driver circuit has reached or crossed a second reference value, the second circuit unit with a second hit signal so that the second circuit unit stops supply of the second clock signal to the second counter circuit in response to the first hit signal.

12. The device as claimed in claim 11, wherein the control circuit includes third and fourth circuit units which respectively output third and fourth clock signals;

wherein the third circuit unit supplies the third clock signal to the first circuit unit and the first determination circuit;

wherein the first circuit unit delays the third clock signal so as to generate the first clock signal;

wherein the first determination circuit outputs the first hit signal in response to the third clock signal, the fourth circuit unit supplies the fourth clock signal to the second circuit unit and the second determination circuit; and wherein the second circuit unit delays the fourth clock signal so as to generate the second clock signal and the second determination circuit outputs the second hit signal in response to the fourth clock signal.

13. The device as claimed in claim 12, wherein the control circuit receives an input clock signal and a first command signal and includes a divider circuit, a command latch circuit and a synchronization circuit;

wherein the divider circuit receives the input clock signal and divides the input clock signal by a predetermined divide ratio so as to generate a divided clock signal;

wherein the command latch circuit outputs one of first and second enable signals in response to the first command signal;

wherein the synchronization circuit receives the divided clock signal and the one of first and second enable signals and output the one of first and second enable signals in response to the divided clock signal; and wherein the first and the third circuit units are activated by the first enable signal, and the second and fourth circuit units are activated by the second enable signal.

14. The device as claimed in claim 11, further comprising;

a second terminal, first and second replica circuits indicative of first replica impedance relative to the first impedance, the first replica circuit being coupled to the second terminal, a third replica circuit indicative of second replica impedance relative to the second impedance and coupled to the second replica circuit at a first node, a first comparator circuit comparing a voltage level of the second terminal with a predetermined voltage to output a first comparison signal to the first determination circuit, the first determination circuit determining whether the first impedance of the first driver circuit has reached or crossed the reference value based on the first comparison signal, and a second comparator circuit comparing a voltage level of the first node with the predetermined voltage to output a first comparison signal to the second determination circuit, the second determination circuit determining whether the second impedance of the second driver circuit has reached or crossed the reference value based on the second comparison signal.

* * * * *